United States Patent [19]

Evans

[11] Patent Number: 5,793,228
[45] Date of Patent: Aug. 11, 1998

[54] NOISE-TOLERANT DYNAMIC CIRCUITS

[75] Inventor: Donald A. Evans, Williston, Vt.

[73] Assignee: International Business Machines Corporation, Armonk, N.Y.

[21] Appl. No.: 792,600

[22] Filed: Jan. 31, 1997

[51] Int. Cl.[6] .............................................. H03K 19/096
[52] U.S. Cl. ............................................. 326/98; 326/121
[58] Field of Search ................................ 326/27, 95, 98, 326/112, 119, 121

[56] References Cited

U.S. PATENT DOCUMENTS

| | | |
|---|---|---|
| 3,671,779 | 6/1972 | Draper et al. . |
| 4,779,013 | 10/1988 | Tanaka . |
| 4,985,644 | 1/1991 | Okihara et al. . |
| 5,237,213 | 8/1993 | Tanoi . |
| 5,430,335 | 7/1995 | Tanoi . |
| 5,541,880 | 7/1996 | Campardo et al. . |
| 5,557,223 | 9/1996 | Kuo . |

FOREIGN PATENT DOCUMENTS 4-56513 A   2/1992   Japan ..................................... 326/121

*Primary Examiner*—Jon Santamauro
*Assistant Examiner*—Don Phu Le
*Attorney, Agent, or Firm*—Whitham, Curtis & Whitham; Robert A. Walsh

[57] ABSTRACT

More noise immunity is added to the inputs of precharged dynamic circuits without changing the functional characteristics of the dynamic circuit. A precharged dynamic circuit has a plurality of inputs connected to respective n-type field effect transistors (NFETs) in a tree between a precharge node and circuit ground. A tree of p-type FETs (PFETs) is connected between each of the inputs and a supply voltage with the output of the circuit being connected to the PFET closest to the supply voltage. When the output turns high, the PFET closest to supply voltage is turned off, preventing the precharged node from being prematurely reset.

8 Claims, 3 Drawing Sheets

NOISE-TOLERANT DYNAMIC CIRCUITS

BACKGROUND OF THE INVENTION

1. Field of the Invention

The present invention generally relates to noise tolerant circuits such as used in very large scale integrated (VLSI) circuits and, more particularly, to improving the noise tolerance of all inputs of dynamic circuits and preventing premature resetting of the circuits.

2. Background Description

Precharged dynamic circuits offer an excellent performance advantage over static circuits; however, precharged dynamic circuits tend to be more susceptible to noise problems. Typical dynamic circuits tend to rely on the device threshold voltage for noise margin on inputs. At process corners with low device threshold voltage, noise generated by line-to-line coupling or charge-sharing may be enough to cause a dynamic circuit to misfire.

SUMMARY OF THE INVENTION

It is therefore an object of the present invention to provide a means to add more noise immunity to the inputs of precharged dynamic circuits without changing the functional characteristics of the dynamic circuit.

According to the invention, there is provided a precharged dynamic circuit having a plurality of inputs connected to respective n-type field effect transistors (NFETs) in a tree between a precharge node and circuit ground. In addition, a tree of p-type FETs (PFETs) is connected between each of the inputs and a supply voltage with the output of the dynamic circuit being connected to the PFET in the tree closest to the supply voltage. The output, when high, turns the PFET closest to the supply voltage off, preventing the precharged node from being prematurely reset.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
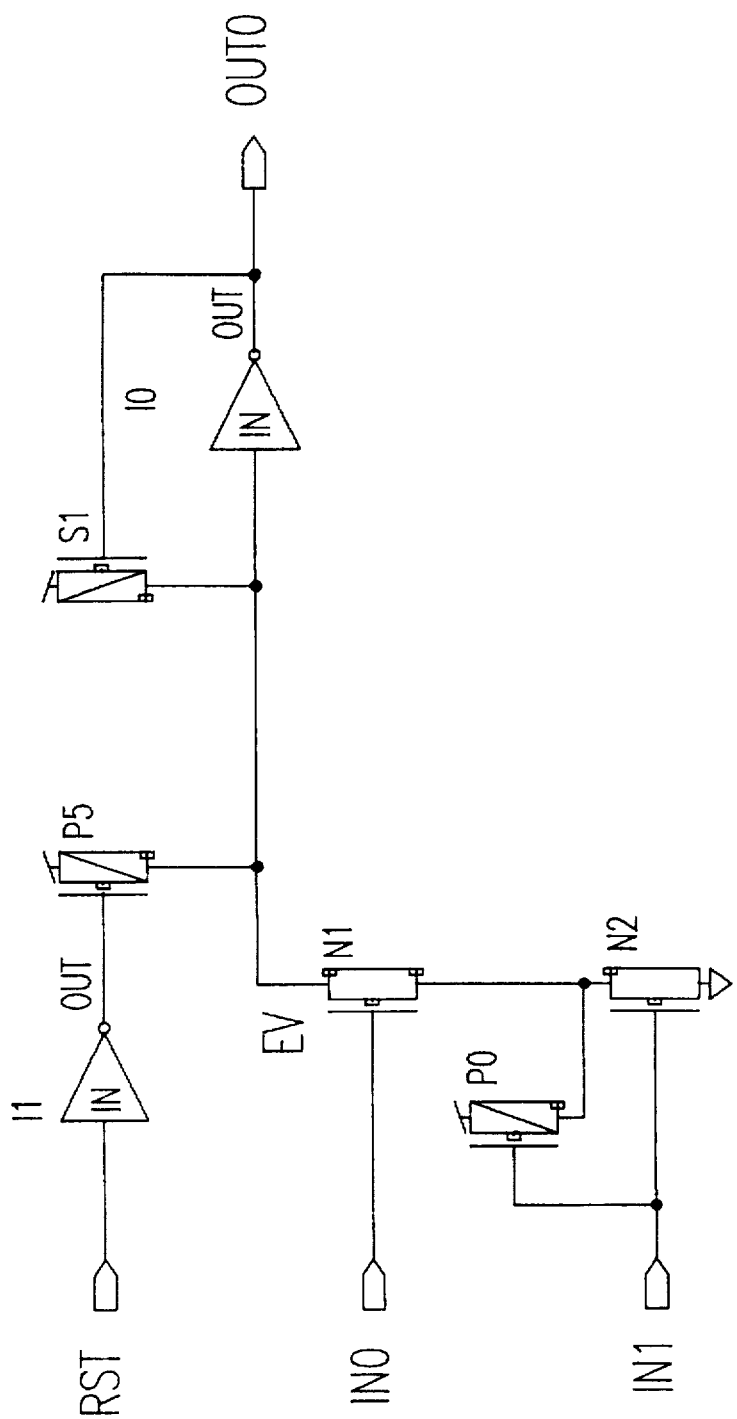
FIG. 1 is a schematic diagram of a dynamic circuit to illustrate one approach to improving noise tolerance.

Referring now to the drawings, and more particularly to FIG. 1, there is shown an input circuit for a precharged dynamic circuit of general application. Inputs IN0 and IN1 are applied to the gates of n-type field effect transistors (NFETS) N1 and N2, respectively. NFETs N1 and N2 are connected in series between a node EV and ground. The node EV is precharged by p-type FET (PFET) P5 which conducts in response to a reset (RST) pulse applied to inverter I1. When NFETs N1 and N2 conduct, node EV is pulled low causing inverter I0 to go high at OUT0. The output of inverter I0 is fed back to PFET S1 to hold node EV high after the circuit is reset by the RST pulse.

The approach shown in FIG. 1 illustrates how to add more noise tolerance to the bottom input IN1 of an NFET tree. The addition of PFET P0 raises the noise tolerance of input IN1. However, a side effect of adding PFET P0 is the circuit may prematurely reset if input IN0 is still asserted while input IN1 resets.

Figure 2:
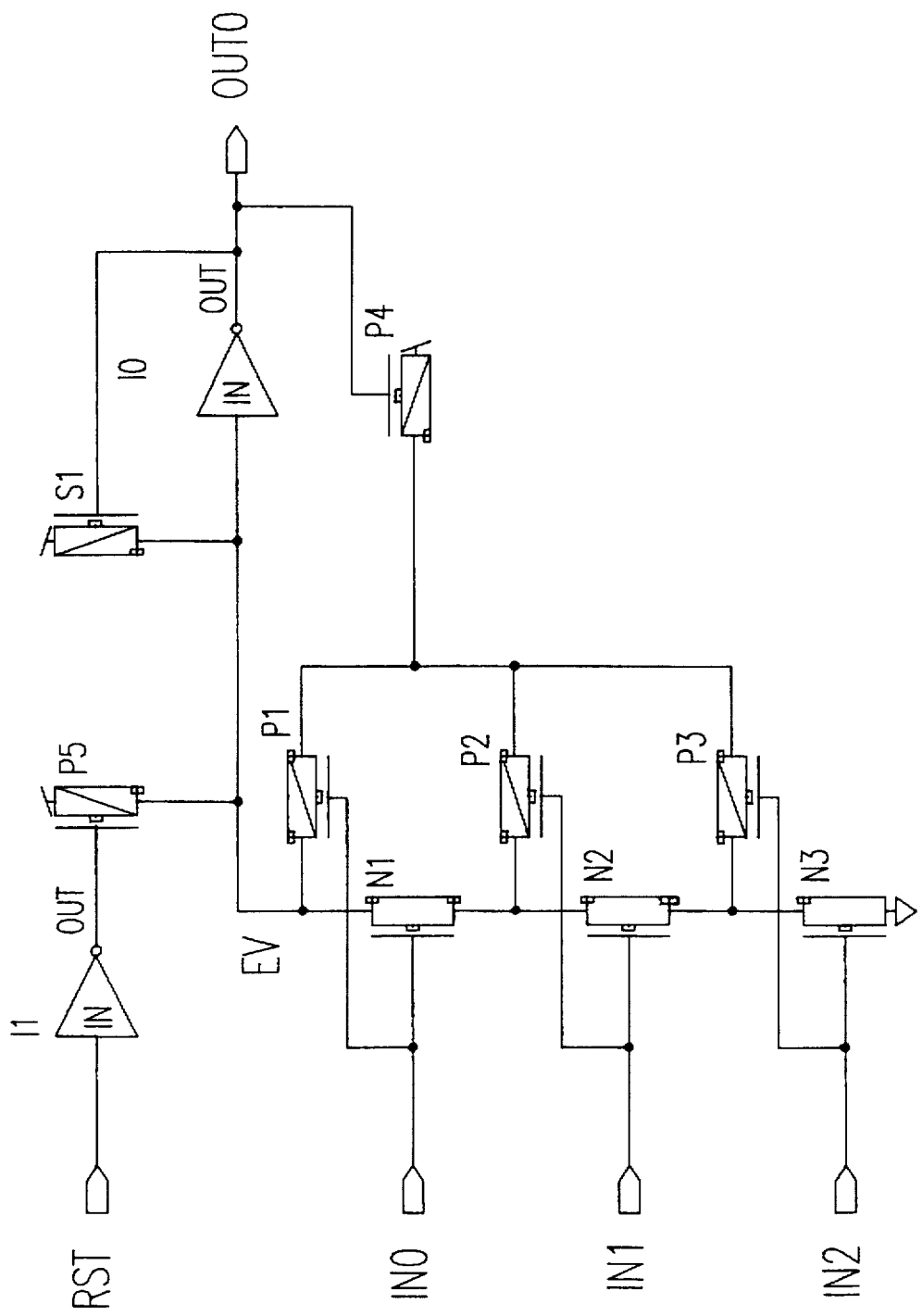
FIG. 2 is a schematic diagram of a dynamic AND circuit with added noise tolerance of each input without premature resetting according to the principles of the invention.

FIG. 2 shows an improved topology that allows all the inputs of the NFET stack to have better noise tolerance and also prevent the premature resetting problem of the circuit in FIG. 1. The devices common to FIG. 1 have the same reference numerals in FIG. 2. The circuit of FIG. 2 is a three-input AND gate and thus includes a third input IN2 and a corresponding NFET N3 in series with NFETs N2 and N1. In FIG. 2, PFETs P1 and P4 are connected in series between the node EV and the supply voltage, VDD, PFETs P2 and P4 are connected in series between the node of NFETs N1 and N2 and VDD, and PFETs P3 and P4 are connected in series between the node of NFETs N2 and N3 and VDD. Input IN0 is connected to the gate of PFET P1, and the output OUT0 is connected to the gate of PFET P4. Input IN1 is connected to the gate of PFET P2, and input IN2 is connected to the gate of PFET P3.

PFET devices P1, P2, P3, and P4 provide noise tolerance better than device threshold voltage, and PFET device P4 is driven by the output OUT0 to prevent the circuit from prematurely resetting when the inputs reset. Prior to the circuit switching, inputs IN0, IN1, and IN2 are precharged low, as well as output OUT0. In this state, PFET devices P1, P2, P3, and P4 are active and the noise tolerance of input IN0 is a function of the ratio of the device widths of transistors P1 and P4 to the device widths of transistors N1, N2, and N3. When the inputs IN0, IN1, and IN2 transition high, NFET devices N1, N2, and N3 are activated, pulling node EV low which drives OUT0 high turning PFET device P4 off. With PFET device P4 off, node EV will not be reset, regardless of the inputs resetting, until input RST transitions low. Once RST transitions low, node EV is reset high and the output OUT0 is reset low. This turns device P4 back on again and the circuit is ready for the next cycle.

Figure 3:
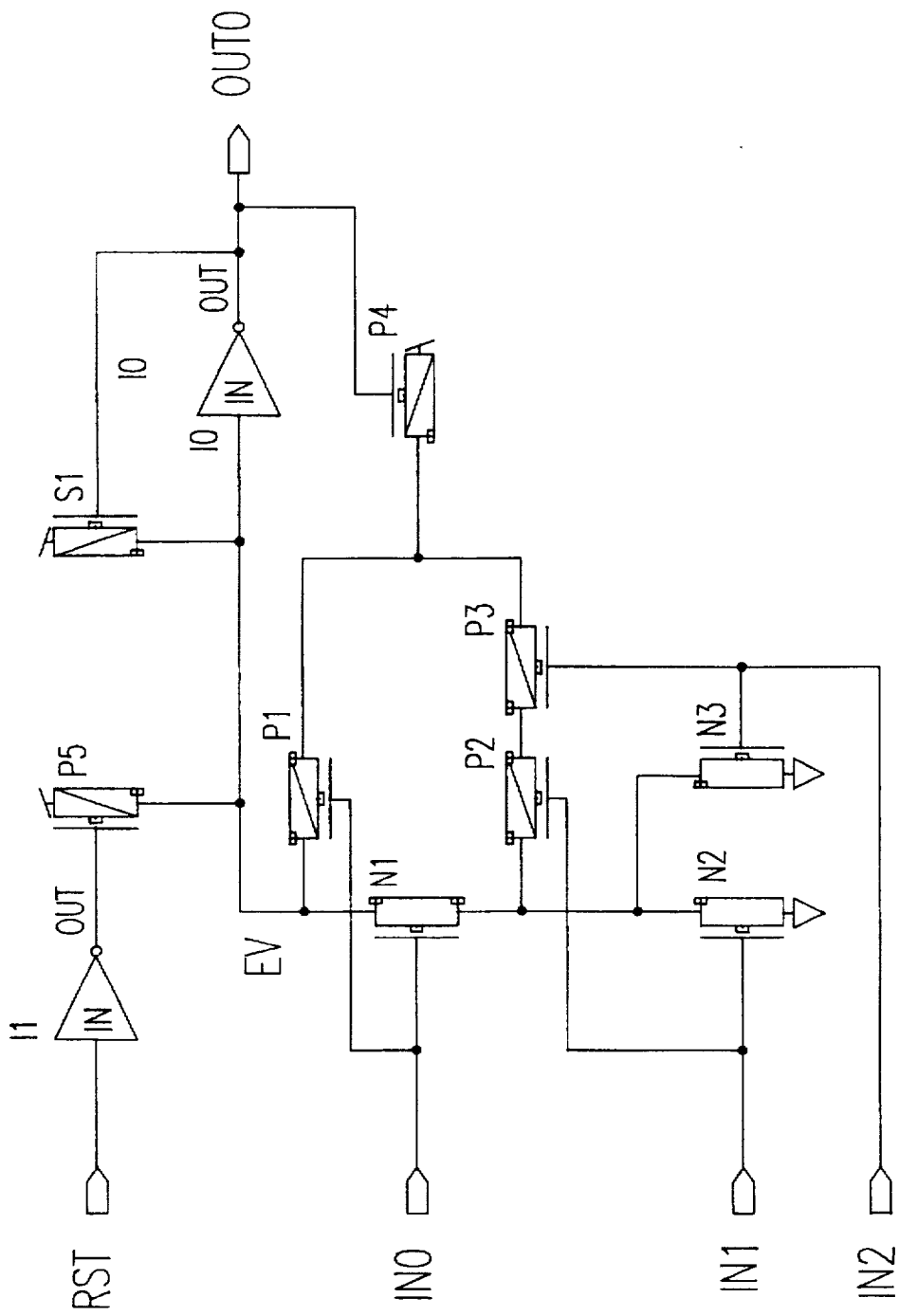
FIG. 3 is a schematic diagram of another dynamic logic circuit with added noise tolerance according to the principles of the invention.

This same approach of feeding back the output to disable the noise protection can be used in various NFET tree configurations, as shown in FIG. 3. Instead of a three input AND gate, the circuit shows input IN0 ANDed with the OR of inputs IN1 and IN2. More specifically, NFET device N3 is connected in parallel with NFET device N2 and PFET device P3 is connected in series with PFET device P2 to provide the OR function.

While the invention has been described in terms of preferred embodiments, those skilled in the art will recognize that the invention can be practiced with modification within the spirit and scope of the appended claims.

Having thus described my invention, what I claim as new and desire to secure by Letters Patent is as follows:

1. A precharged dynamic circuit with increased noise immunity without changing functional characteristics of the dynamic circuit comprising:

a plurality of inputs connected to respective n-type field effect transistors (NFETS) in a NFET tree connected between a precharge node and circuit ground; and a PFET tree of p-type FETs (PFETs) connected between each of the inputs and a supply voltage with an output of the dynamic circuit being connected to a PFET closer to the supply voltage in a series connection of at least two PFETs in said PFET tree such that when the output turns high, the PFET closer to the supply voltage is turned off, preventing the precharged node from being prematurely reset.

2. The precharged dynamic circuit recited in claim 1 wherein there are at least two inputs and the NFET tree comprises first and second NFETs connected in series between the precharge node and circuit ground, each of said inputs being connected to a gate of a respective one of said first and second NFETs, and wherein the PFET tree comprises first, second and third PFETs, the first and third PFETs being connected in series between the precharge node and the supply voltage and the second and third PFETs being connected in series between a junction of the first and second NFETs and the supply voltage, each of said inputs being connected to a gate of a respective one of said first and second PFETs and the output being connected to a gate of the third PFET.

3. The precharged dynamic circuit recited in claim 2 further comprising a third NFET connected in series with the first and second NFETs, a third input connected to a gate of the third NFET, and a fourth PFET connected in series between a junction of the third NFET and the second NFET and the third PFET, the third input being connected to a gate of the fourth PFET.

4. The precharged dynamic circuit recited in claim 2 further comprising a third NFET connected in parallel with the second NFET, a third input connected to a gate of the third NFET, and a fourth PFET connected in series with the second and third PFETs, the third input being connected to a gate of the fourth PFET.

5. The precharged dynamic circuit recited in claim 2 further comprising:

an inverter connected between the precharge node and the output; and a fourth PFET connected between the supply voltage and the precharge node, a gate of the fourth PFET being connected to the output.

6. The precharged dynamic circuit recited in claim 5 further comprising a fifth PFET connected between the supply voltage and the precharge node, a gate of the fifth PFET receiving a reset pulse to precharge the node.

7. The precharged dynamic circuit recited in claim 1 wherein there are at least two inputs and the NFET three comprises first and second NFETs connected in parallel between the precharge node and circuit ground, each of said inputs being connected to a gate of a respective one of said first and second NFETs, and wherein the PFET three comprises first, second and third PFETs connected in series between the precharge node and the voltage supply, each of said inputs being connected to a gate of a respective one of said first and second PFETs and the output being connected to a gate of the third PFET.

8. A precharged dynamic circuit with increased noise immunity without changing functional characteristics of the dynamic circuit comprising:

a plurality of inputs connected to respective n-type field effect transistors (NFETs) in a NFET tree connected between a precharge node and circuit ground; and a PFET tree of p-type FETs (PFETS) connected between each of the inputs and a supply voltage with an output of the dynamic circuit being connected to a first PFET in series with other PFETs of said PFET tree such that when the output of the dynamic circuit turns high, the PFET is turned off, preventing the precharged node from being prematurely reset.

* * * * *